US007688123B2

(12) United States Patent
Oh

(10) Patent No.: US 7,688,123 B2
(45) Date of Patent: Mar. 30, 2010

(54) DELAY APPARATUS, AND DELAY LOCKED LOOP CIRCUIT AND SEMICONDUCTOR MEMORY APPARATUS USING THE SAME

(75) Inventor: Young-Hoon Oh, Gyeonggi-do (KR)

(73) Assignee: SNK Patent Law Offices, Gyeonggi-do (KR)

( * ) Notice: Subject to any disclaimer, the term of this patent is extended or adjusted under 35 U.S.C. 154(b) by 90 days.

(21) Appl. No.: 11/826,648

(22) Filed: Jul. 17, 2007

(65) Prior Publication Data
US 2008/0191773 A1    Aug. 14, 2008

(30) Foreign Application Priority Data
Feb. 12, 2007    (KR) .................... 10-2007-0014573

(51) Int. Cl.
*H03L 7/06* (2006.01)
(52) U.S. Cl. .................... 327/158; 327/149; 327/161
(58) Field of Classification Search ............... 327/149, 327/158, 161
See application file for complete search history.

(56) References Cited

U.S. PATENT DOCUMENTS

| 6,069,506 | A  | * | 5/2000  | Miller et al. ................ 327/156 |
| 6,448,756 | B1 | * | 9/2002  | Loughmiller ............ 324/76.54 |
| 6,586,979 | B2 | * | 7/2003  | Gomm et al. ............... 327/161 |
| 6,593,786 | B2 | * | 7/2003  | Jung ........................ 327/158 |
| 6,943,602 | B1 |   | 9/2005  | Lee |
| 6,944,833 | B2 | * | 9/2005  | Jeon ............................. 716/1 |
| 6,985,401 | B2 |   | 1/2006  | Jang et al. |
| 6,987,408 | B2 |   | 1/2006  | Kim |
| 6,995,591 | B2 |   | 2/2006  | Lee |
| 7,103,133 | B2 |   | 9/2006  | Jung |
| 7,116,146 | B2 | * | 10/2006 | Tokuhiro .................... 327/158 |
| 7,126,400 | B2 | * | 10/2006 | Tamura ...................... 327/261 |
| 7,375,565 | B2 | * | 5/2008  | Kwak ......................... 327/158 |
| 2005/0195663 | A1 |   | 9/2005  | Kwak |

FOREIGN PATENT DOCUMENTS

| JP | 2003-45183  | A | 2/2003  |
| JP | 2004-104747 | A | 4/2004  |
| JP | 2005-184196 |   | 7/2005  |
| JP | 2005-251368 | A | 9/2005  |
| JP | 2005-332548 | A | 12/2005 |

(Continued)

*Primary Examiner*—Lincoln Donovan
*Assistant Examiner*—Patrick O'Neill
(74) *Attorney, Agent, or Firm*—Venable LLP; Jeffri A. Kaminski

(57) ABSTRACT

A delay apparatus, and a delay locked loop circuit and a semiconductor memory apparatus using the same are provided. A delay locked loop circuit includes a register controlled delay part that delays a plurality of clocks input during an initial operation by delay amounts among initial delay amounts to be varied, which are set according to initial state setting signals, and increases or decreases the set delay amounts according to a phase detecting signal after the initial operation, a phase comparator that compares a phase of any one of the plurality of clocks and a phase of any one of the plurality of clocks delayed by the register controlled delay part and outputs the phase detecting signal, and an initial state setting unit that generates the initial state setting signals.

7 Claims, 8 Drawing Sheets

FOREIGN PATENT DOCUMENTS

| KR | 1019990029128 | 4/1999 |
| KR | 2003-0002130 | 8/2003 |
| KR | 1020040037798 | 5/2004 |
| KR | 1020050096829 | 10/2005 |
| KR | 100668861 | 1/2007 |
| KR | 1020070007317 | 1/2007 |

* cited by examiner

[FIG. 5]
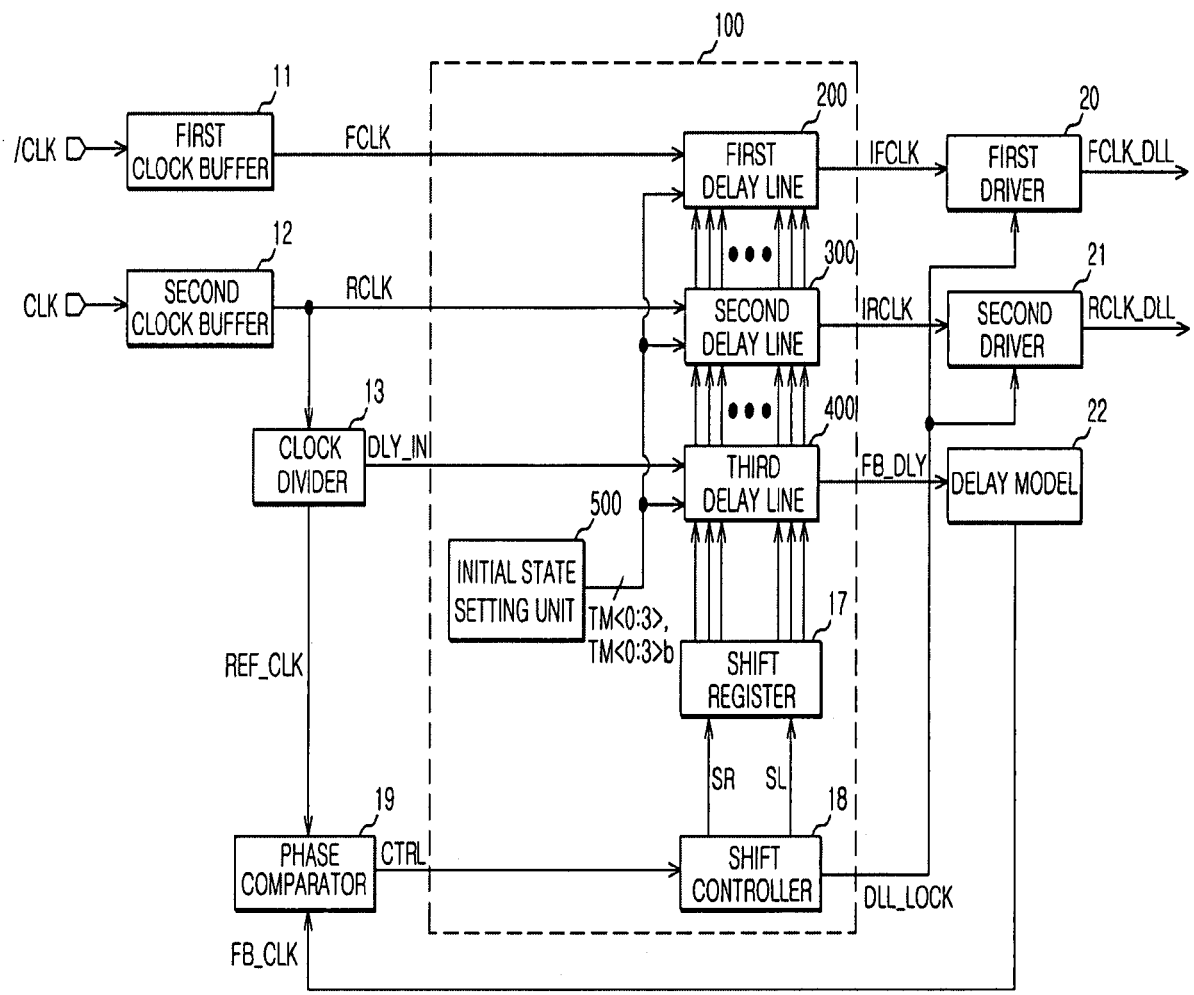

[FIG. 6]
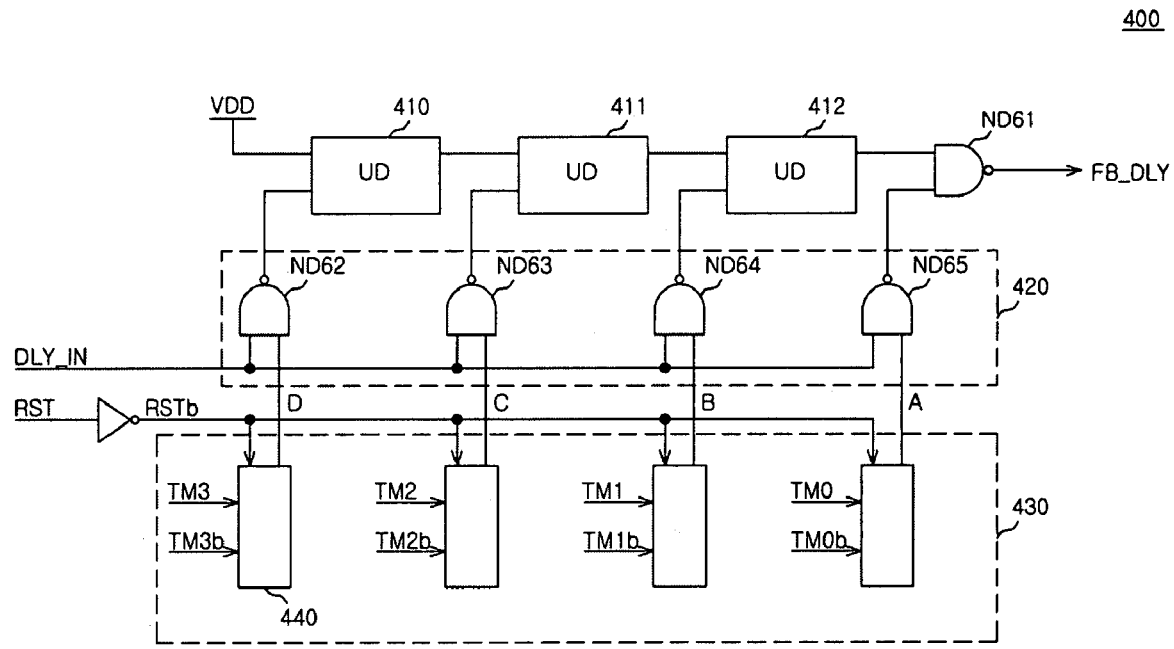
[FIG. 7]
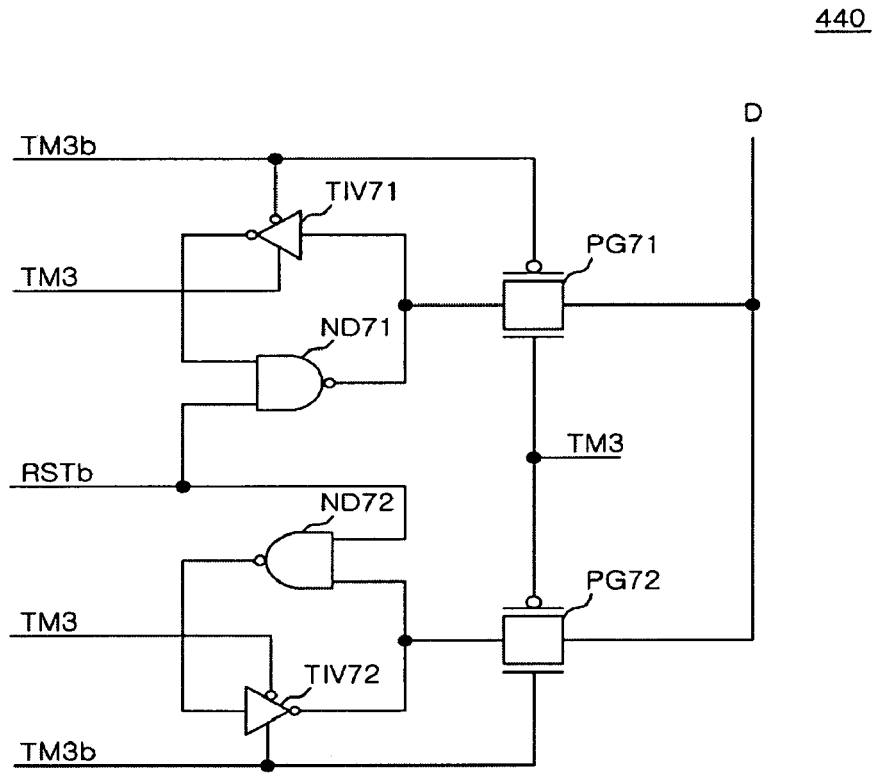

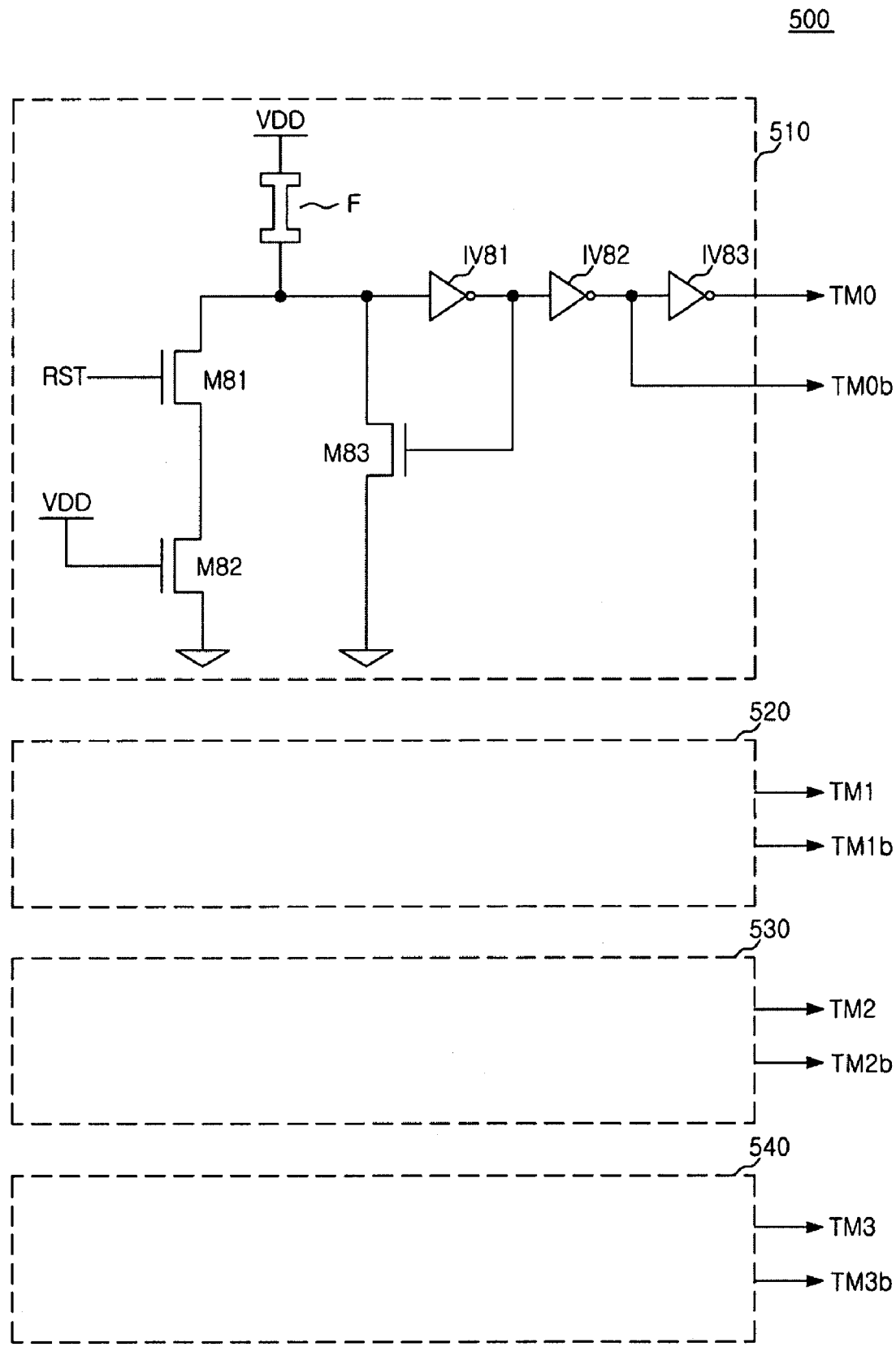
[FIG. 8]

[FIG. 9A]
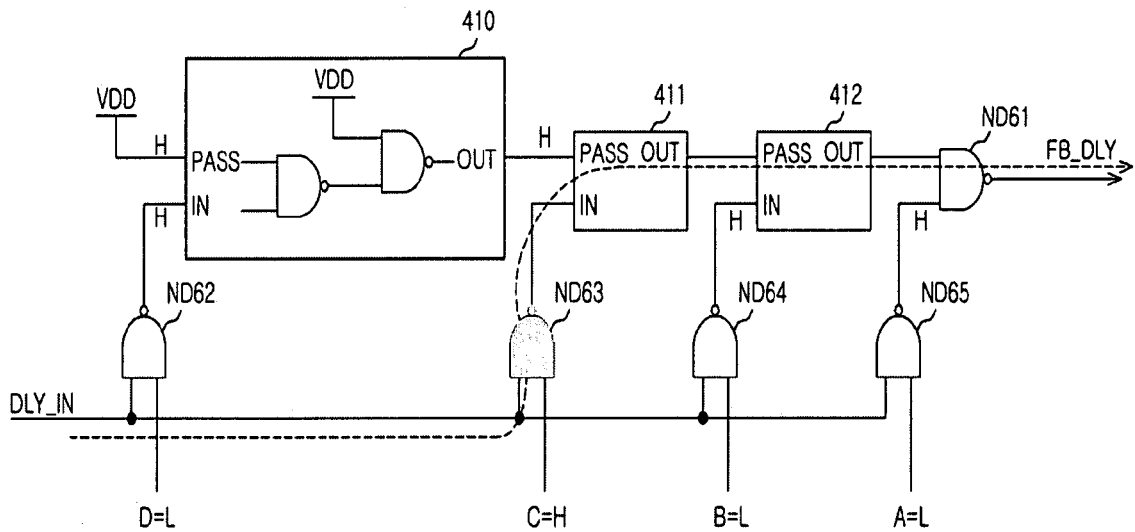
[FIG. 9B]
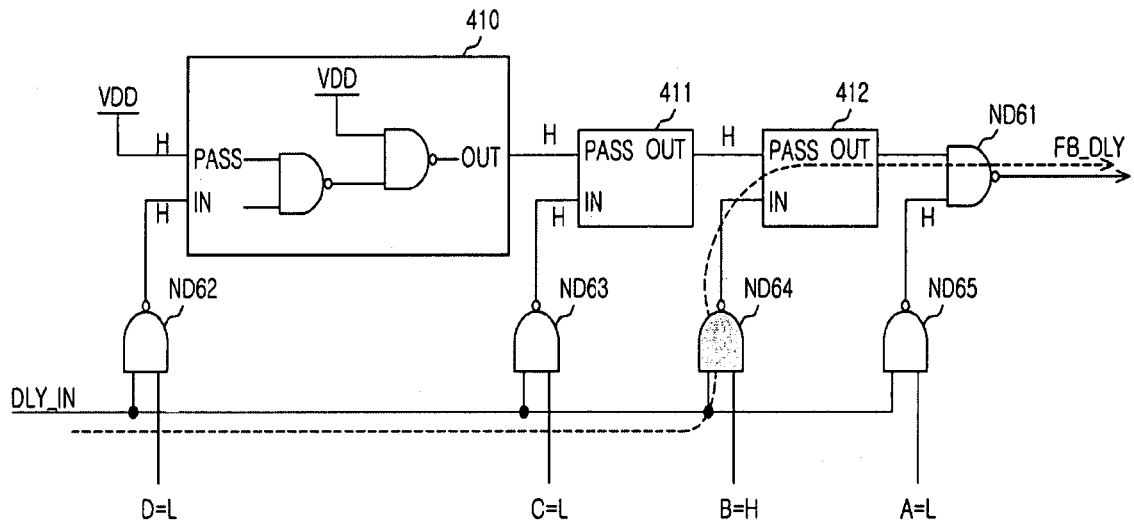

DELAY APPARATUS, AND DELAY LOCKED LOOP CIRCUIT AND SEMICONDUCTOR MEMORY APPARATUS USING THE SAME

CROSS-REFERENCE TO RELATED PATENT APPLICATION

This application claims the benefit of Korean Patent Application No. 10-2007-0014573, filed on Feb. 12, 2007, in the Korean Intellectual Property Office, the disclosure of which is incorporated herein in its entirety by reference.

BACKGROUND OF THE INVENTION

1. Technical Field

Embodiments of the present invention relate to a semiconductor circuit technology, and more particularly, to a delay apparatus and a delay locked loop circuit and a semiconductor memory apparatus using the same.

2. Related Art

In general, clocks that are used in a semiconductor memory apparatus have been used as references to match the timing of operations, and have been used to achieve high-speed operation without the occurrence of errors. When the clock that is input from the outside of the semiconductor memory apparatus is used inside the semiconductor memory apparatus, a clock skew due to an internal circuit, that is, a time delay, is generated. In order to compensate for the time delay such that an internal clock and an external clock have the same phase, a delay locked loop circuit is generally used.

As shown in FIG. 1, a delay locked loop circuit according to the related art includes a first clock buffer 11, a second clock buffer 12, a clock divider 13, a first delay line 14, a second delay line 15, a third delay line 16, a shift register 17, a first driver 20, a second driver 21, a delay model 22, a phase comparator 19, and a shift controller 18. The first clock buffer 11 receives an inverted external clock/CLK and generates a first internal clock FCLK synchronized with a falling edge of an external clock CLK. The second clock buffer 12 receives the external clock CLK and generates a second internal clock RCLK synchronized with a rising edge of the external clock CLK. The clock divider 13 divides the second internal clock RCLK by 1/N (N is a positive number) and outputs a delay monitoring clock DLY_IN and a reference clock REF_CLK. The first delay line 14 receives and delays the first internal clock FCLK. The second delay line 15 receives and delays the second internal clock RCLK. The third delay line 16 receives and delays the delay monitoring clock DLY_IN. The shift register 17 determines a delay amount by each of the first to third delay lines 14 to 16. The first driver 20 responds to a delay locked signal DLL_LOCK and drives the output IFCLK of the first delay line 14 so as to generate a first delay locked loop clock FCLK_DLL. The second driver 21 responds to the delay locked signal DLL_LOCK and drives the output IRCLK of the second delay line 15 so as to generate a second delay locked loop clock RCLK_DLL. The delay model 22 allows the output FB_DLY of the third delay line 16 to pass through the same delay path as an actual clock path and outputs the output FB_DLY of the third delay line 16 as a feedback clock FB_CLK. The phase comparator 19 compares the phase of the feedback clock FB_CLK with the phase of the reference clock REF_CLK and outputs a phase detecting signal CTRL. The shift controller 18 responds to the phase detecting signal CTRL, and outputs shift control signals SR and SL to control a shift direction of the shift register 17 and the delay locked signal DLL_LOCK indicating that a delay locking operation has been performed.

The delay model 22 includes a dummy clock buffer, a dummy output buffer, a dummy load, and the like, and is also referred to as a replica circuit. The first to third delay lines 14 to 16, the shift register 17, and the shift controller 18 are collectively referred to as a register controlled delay part 10.

The first to third delay lines 14 to 16 have the same structure. Among the first to third delay lines 14 to 16, the third delay line 16 includes a plurality of unit delays (UD) 16-1, and link circuits (not shown) that determine the number of unit delays among the plurality of unit delays 16-1, which an input signal passes through, in accordance with the output of the shift register 17, as shown in FIG. 2.

The operation of the delay locked loop circuit according to the related art that has the above-described structure will now be described.

At the time of an initial operation, that is, at a timing when a reset signal is enabled, the delay monitoring clock DLY_IN passes through only one of the unit delays set in advance to be adjusted for the initial state of the third delay line 16, passes through the delay model 22, and is output as the feedback clock FB_CLK.

The phase comparator 19 compares rising edges of the reference clock REF_CLK and the feedback clock FB_CLK and outputs the phase detecting signal CTRL.

The shift controller 18 outputs the shift control signals SR and SL in response to the phase detecting signal CTRL.

The shift register 17 determines a delay amount by each of the first to third delay lines 14 to 16 in response to the shift control signals SR and SL. If the shift control signal SR is input, the shift register 17 shifts a register value to the right side, and if the shift control signal SL is input, the shift register 17 shifts the register value to the left side. In this way, the shift register 17 adjusts the delay amount.

Then, the shift controller 18 outputs the delay locked signal DLL_LOCK indicating that a delay locking operation has been performed at a timing when the feedback clock FB_CLK and the reference clock REF_CLK have the least amount of jitter.

The first and second drivers 20 and 21 drive the output IFCLK of the first delay line 14 and the output IRCLK of the second delay line 15 in response to the delay locked signal DLL_LOCK, which generates the first delay locked loop clock FCLK_DLL and the second delay locked loop clock RCLK_DLL that are synchronized with the external clock CLK.

The delay operation according to the related art will now be described in detail with reference to FIGS. 3A to 4B.

The first to third delay lines 14 to 16 are constructed such that if the delay locked loop circuit is initialized, an input signal, that is, the delay monitoring clock DLY_IN is output through the last unit delay, which cannot be changed.

As shown in FIG. 3A, it is assumed that the phase of the feedback clock FB_CLK is earlier than the phase of the reference clock REF_CLK by "D". In this case, the feedback clock FB_CLK needs to be delayed by "D" so as to synchronize with the reference clock REF_CLK. Accordingly, a delay amount is increased by increasing the number of unit delays which the feedback clock FB_CLK passes through, starting from the last unit delay of the third delay line 16.

As shown in FIG. 3B, it is assumed that the phase of the feedback clock FB_CLK is slightly later than the phase of the reference clock REF_CLK. As described above, since the third delay line 16 uses only the last unit delay during an initial operation, the delay amount cannot be decreased any more. Accordingly, in order for the feedback clock FB_CLK to synchronize with the reference clock REF_CLK, the feedback clock FB_CLK needs to be delayed for almost a time of period tCK. Since the delay amount by all of the unit delays does not exceed a time of period tCK, the maximum unit delays are used in the case shown in FIG. 3B.

As shown in FIG. 3C, it is assumed that the phase of the reference clock REF_CLK is slightly later than the phase of the feedback clock FB_CLK. At this time, the third delay line 16 uses only the last unit delay, and the minimum unit delay is used in the case shown in FIG. 3C.

Meanwhile, as shown in FIG. 4A, when a change in PVT (Process/Voltage/Temperature) is generated after the delay locking operation is performed, that is, the phase of the feedback clock FB_CLK synchronizes with the phase of the reference clock REF_CLK, the phase of the feedback clock FB_CLK may be slightly later than the phase of the reference clock REF_CLK. The first to third delay lines 14 to 16 and the delay model 22 include inverters or logic gates, each delay value is changed according to the change in PVT, and the delay value is increased when the voltage is decreased.

As shown in FIG. 4A, since the phase of the feedback clock FB_CLK is later than the phase of the reference clock REF_CLK by "D2" after the delay locking operation is performed, the delay amount by the delay lines needs to be decreased, such that the feedback clock FB_CLK synchronizes with the reference clock REF_CLK.

However, if the delay amount "D1" by the unit delay is smaller than the delay amount to be decreased, the feedback clock FB_CLK cannot synchronize with the reference clock REF_CLK, and the constant phase difference "D2−D1" is generated, as shown in FIG. 4B.

As described above, in the delay locked loop circuit according to the related art, the delay amount during the initial operation is locked. If the locked delay amount is smaller than the delay amount to be compensated for, the two clocks cannot be synchronized with each other, and thus the functionality of the delay locked loop is decreased. When the phase difference between the two clocks, which cannot be corrected, departs from an operating range of the semiconductor memory apparatus, a defective operation occurs not only in the delay locked loop circuit but also in the semiconductor memory apparatus using the same.

SUMMARY

Exemplary embodiments may provide a delay apparatus and a delay locked loop circuit, and a semiconductor memory apparatus using the same, that are capable of maximizing a delay locked function.

One embodiment may provide a delay apparatus. The delay apparatus may include a plurality of unit delays that may receive output signals of previous terminals, a signal input unit that may input received signals to any one of the plurality of unit delays which corresponds to any one of initial state selecting signals, and an initial state selecting unit that may generate the initial state selecting signals in response to initial state setting signals and output the initial state selecting signals to the signal input unit.

One embodiment may provide a delay locked loop circuit. The delay locked loop circuit may include a register controlled delay part that may delay a plurality of clocks input during an initial operation by delay amounts among initial delay amounts to be varied, which may be set according to initial state setting signals, and may increase or decrease the set delay amounts according to a phase detecting signal after the initial operation, a phase comparator that may compare a phase of any one of the plurality of clocks and a phase of any one of the plurality of clocks delayed by the register controlled delay part and output the phase detecting signal, and an initial state setting unit that may generate the initial state setting signals.

One embodiment may provide a semiconductor memory apparatus. The semiconductor memory apparatus may include a delay locked loop circuit that may delay a plurality of input clocks by delay amounts among initial delay amounts to be varied, which may be set according to initial state setting signals, and may increase or decrease the set delay amounts according to a phase detecting signal after an initial operation so as to perform a delay locking operation, and an initial state setting unit that may generate the initial state setting signals.

BRIEF DESCRIPTION OF THE DRAWINGS

FIG. 5 is an exemplary block diagram illustrating a delay locked loop circuit.

FIG. 6 is an exemplary circuit diagram illustrating a delay line.

FIG. 7 is an exemplary circuit diagram illustrating an initial state selecting unit shown in FIG. 6.

FIG. 8 is an exemplary circuit diagram illustrating an initial state setting unit shown in FIG. 5.

FIGS. 9A and 9B are exemplary circuit diagrams illustrating the operation of a delay line.

DESCRIPTION OF EXEMPLARY EMBODIMENT

Figure 1:
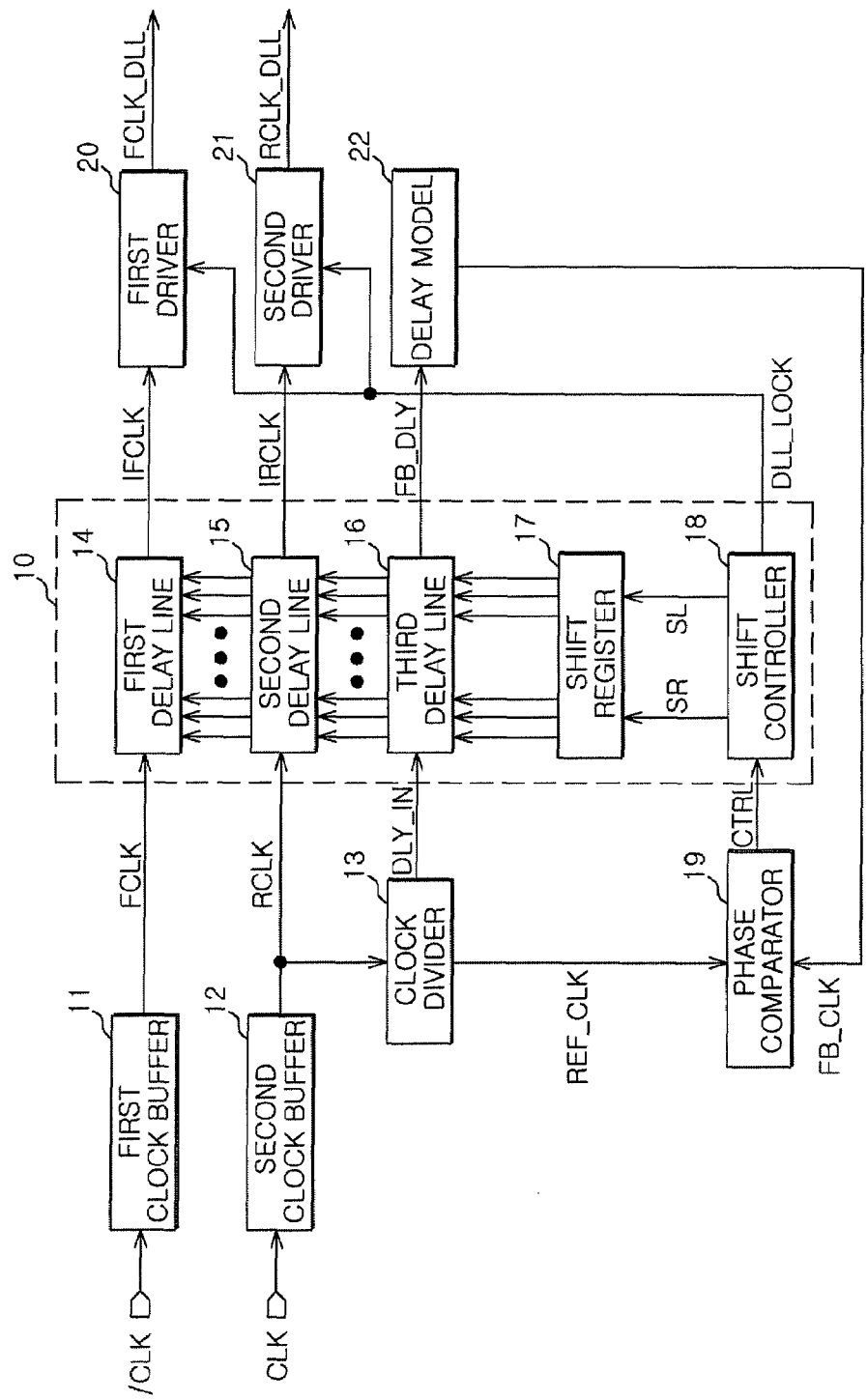
FIG. 1 is a block diagram illustrating a delay locked loop circuit according to the related art.
Figure 2:
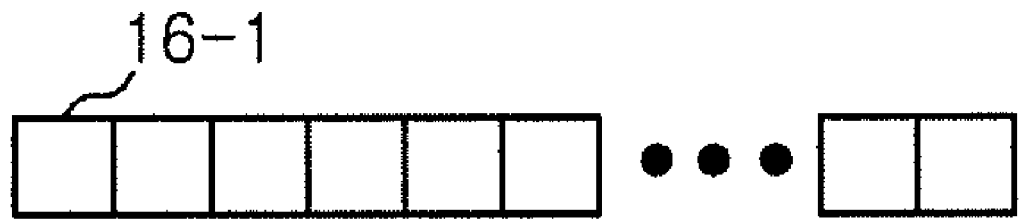
FIG. 2 is a diagram illustrating a structure of a delay line according to the related art.
Figure 3A:
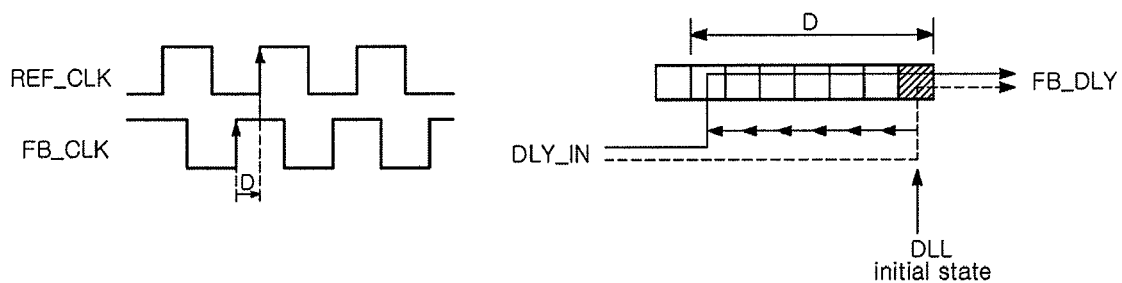
FIGS. 3A to 3C are timing diagrams illustrating the operation of a delay line according to the related art.
Figure 3B:
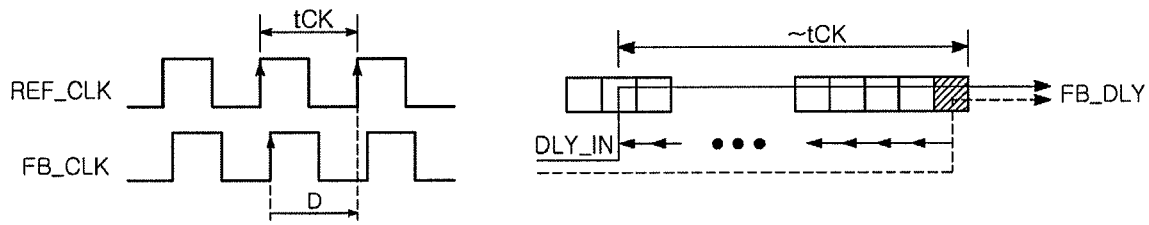
Figure 3C:
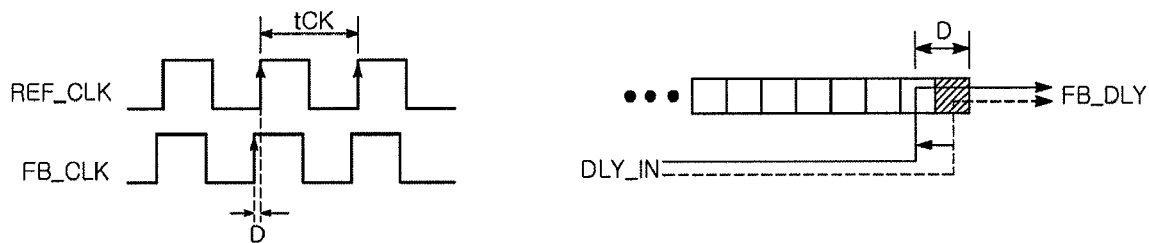
Figure 4A:
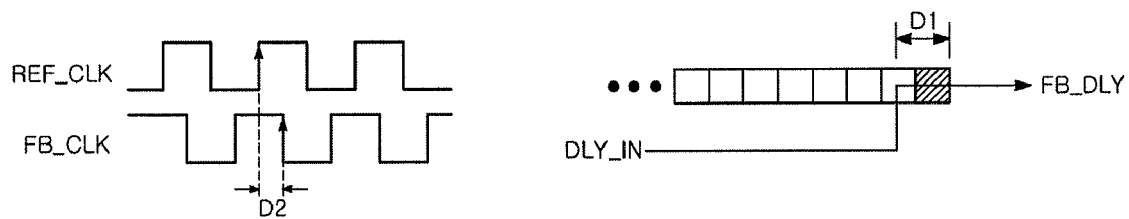
FIG. 4A is a timing diagram illustrating error occurrence in a delay line according to the related art.
Figure 4B:
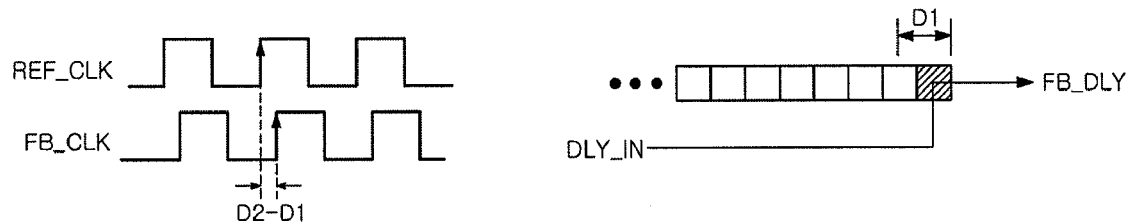
FIG. 4B is a timing diagram illustrating an operation error of a delay line according to the related art.

Exemplary embodiments will now be described in detail with reference to the accompanying drawings.

As shown in FIG. 5, a delay locked loop circuit according to one embodiment may include a first clock buffer 11, a second clock buffer 12, a clock divider 13, a register controlled delay part 100, a delay model 22, a phase comparator 19, a first driver 20, and a second driver 21. The first clock buffer 11 may receive an inverted external clock/CLK and generate a first internal clock FCLK synchronized with a falling edge of an external clock CLK. The second clock buffer 12 may receive the external clock CLK and generate a second internal clock RCLK synchronized with a rising edge of the external clock CLK. The clock divider 13 may divide the second internal clock RCLK by 1/N, where N is a positive number, and output a delay monitoring clock DLY_IN and a reference clock REF_CLK. The register controlled delay part 100 may delay the plurality of clocks FCLK, RCLK, and DLY_IN input during an initial operation by delay amounts among initial delay amounts to be varied, which may be set according to initial state setting signals TM<0:3> and TM<0:3>b, and may increase or decrease the set delay amounts according to a phase detecting signal CTRL after the initial operation. The delay model 22 may allow the output FB_DLY of the register controlled delay part 100 to pass through the same delay path as an actual clock path so FB_DLY maybe output as the feedback clock FB_CLK. The phase comparator 19 may compare the phase of the reference clock REF_CLK with the phase of the feedback clock FB_CLK and output the phase detecting signal CTRL. The first driver 20 may respond to a delay locked signal DLL_LOCK and drive the output IFCLK of the register controlled delay part 100 so the first driver 20 may generate a first delay locked loop clock FCLK_DLL. The second driver 21 may respond to the delay locked signal DLL_LOCK and drive the output IRCLK of the register controlled delay part 100 so the second driver 21 may generate a second delay locked loop clock RCLK_DLL.

The register controlled delay part 100 may include first to third delay lines 200 to 400 that may delay the plurality of clocks FCLK, RCLK, and DLY_IN by delay amounts or register values set according to the initial state setting signals TM<0:3> and TM<0:3>b, a shift register 17 that may output register values corresponding to shift control signals SR and SL, a shift controller 18 that may output the shift control signals SR and SL to the shift register 17 according to the phase detecting signal CTRL, and an initial state setting unit 500 that may generate the initial state setting signals TM<0:3> and TM<0:3>b.

The first to third delay lines 200 to 400 may have the same structure. As shown in FIG. 6, among the first to third delay lines 200 to 400, the third delay line 400 may include a plurality of unit delays (UD), for example three UDs 410 to 412 that may receive output signals of previous UDs, a NAND gate ND61 that may receive the output of the last unit delay 412, a signal input unit 420 that may input a delay monitoring clock DLY_IN to any one of the plurality of unit delays 410 to 412 or the NAND gate ND61, which corresponds to any one of the initial state selecting signals A to D, and an initial state selecting unit 430 that may generate the initial state selecting signals A to D in response to the initial state setting signals TM<0:3> and TM<0:3>b and output them to the signal input unit 420. Three unit delays 410 to 412 are exemplary, and a larger or smaller amount of unit delays maybe provided, and a total delay amount of the unit delays may correspond to a time of period tCK of the delay monitoring clock DLY_IN.

In the structure of the delay line, structures of circuits, which may increase or decrease delay amounts according to register values of the shift register 17 after the initial operation, are omitted.

The signal input unit 420 may include a plurality of NAND gates, for example, three NAND gates ND62 to ND65 that may invert the delay monitoring clock DLY_IN in accordance with the initial state selecting signals A to D and output it to the plurality of unit delays 410 to 412 and the NAND gate ND61, respectively.

The initial state selecting unit 430 may include a plurality of logic circuits 440 that may generate the initial state selecting signals A to D, when the initial state setting signals TM<0:3> and TM<0:3>b are activated, by using a reset signal RSTb. The plurality of logic circuits 440 may have the same structure. Each of the plurality of logic circuits 440 may include, for example, two latch circuits that generate and output the initial state selecting signals having different levels by using the reset signal RSTb in accordance with the initial state setting signals and maintain output levels of the initial state selecting signals. Among the plurality of logic circuits 440, the logic circuit 440 that may receive the initial state setting signals TM3 and TM3b may have a structure shown in FIG. 7. Specifically, the logic circuit 440 may include, for example, a first NAND gate ND71 that may receive the reset signal RSTb, a first tri-state inverter TIV71 that may allow the output of the first NAND gate ND71 to be fed back to the first NAND gate ND71 in accordance with the initial state setting signals TM3 and TM3b, a first pass gate PG71 that may output a high-level signal output by the first NAND gate ND71 as the initial state selecting signal D in accordance with the initial state setting signals TM3 and TM3b, a second NAND gate ND72 that may receive the reset signal RSTb, a second tri-state inverter TIV72 that may allow the output of the second NAND gate ND72 to be fed back to the second NAND gate ND72 in accordance with the initial state setting signals TM3b and TM3, and a second pass gate PG72 that may output a low-level signal output by the second NAND gate ND72 as the initial state selecting signal D in accordance with the initial state setting signals TM3b and TM3.

As shown in FIG. 8, the initial state setting unit 500 may include a plurality of fuse sets, for example, fuse sets 510 to 540. The plurality of fuse sets 510 to 540 may have the same structure. For example, the fuse set 510 may include a fuse F that may have one end coupled to a power supply terminal VDD, a first transistor M81 that may have a source coupled to the other end of the fuse F and a gate that may receive a reset signal RST, a second transistor M82 that may have a source coupled to a drain of the first transistor M81, a drain that maybe coupled to a ground terminal VSS, a gate that maybe coupled to a power supply terminal VDD, a series of inverters IV81 to IV83 that may be coupled to the other end of the fuse F, a latch transistor M83 that may have a source coupled to an input terminal of the inverter IV81, a drain that may be coupled to a ground, and a gate that may be coupled to an output terminal of the inverter IV81.

It may be possible to use test mode signals as the initial state setting signals TM<0:3> and TM<0:3>b to test the operation of the semiconductor memory apparatus. In this case, the initial state setting unit 500 may not be provided.

The operation of the delay locked loop circuit according to one embodiment that has the above-described structure will now be described.

In addition to normal operation, the delay locking operation may need to be accurately and stably performed even if a change in PVT is generated.

Accordingly, the normal conditions and changes in the PVT may be defined by the tests. Determining the number of unit delays that correspond to the delay amount selected in the initial operation state of the delay locked loop circuit, that is, an optimal delay amount, by operating the delay locked loop circuit while the number of unit delays is changed, may be performed.

Since the first to third delay lines 200 to 400 may perform the same operation, the operation of the third delay line 400 will be exemplified.

The activation of the initial state setting signals TM<0:3> and TM<0:3>b will be described with reference to FIG. 8. When the fuse F is not cut, the initial state setting signals TM0 and TM0b may be inactivated at a low level and a high level, respectively. When the fuse F is cut, the reset signal RST may be input in a form of a pulse. As a result, the initial state setting signals TM0 and TM0b may be activated at a high level and a low level, respectively, and the output levels thereof may be maintained by the latch transistor M83.

First, a test may be performed while the initial state setting signals TM<0:3> and TM<0:3>b are sequentially activated, which may increase a delay amount.

As shown in FIG. 7, in the logic circuit 440, if the reset signal RST is input in a form of a pulse in a state where an initial state setting signal TM3 is activated at a high level, the first NAND gate ND71 may output a high-level signal while an inverted reset signal RSTb may be at a low level. Since the initial state setting signal TM3 may be at a high level, the first tri-state inverter TIV71 and the first pass gate PG71 maybe turned on. Accordingly, the initial state selecting signal D may be output at a high level through the first pass gate PG71.

When the initial state setting signals TM<0:3> and TM<0:3>_b input to the logic circuits 440 are not activated, the logic circuits 440 may output all of the initial state selecting signals A to C at a low level.

In accordance with the levels of the initial state selecting signals A to D, the NAND gates ND62 to ND65 of the signal input unit 420 may invert and output the delay monitoring clock DLY_IN or output a high-level signal.

As shown in FIG. 9A, when all of the initial state selecting signals A, B, and D except for the initial state selecting signal C are at a low level, the NAND gate ND63 may invert the delay monitoring clock DLY_IN and output it to the unit delay 411. Meanwhile, the NAND gates ND62, ND64, and ND65 may output high-level signals to the unit delays 410 and 412 and the NAND gate ND61. As shown in FIG. 9A, each unit delay may have a structure in which two NAND gates are coupled to each other. Accordingly, the delay monitoring clock DLY_IN may be inverted by the NAND gate ND63, then delayed by the unit delays 411 and 412, and inverted again by the NAND gate ND61, such that the delay monitoring clock DLY_IN may be output at an original phase.

As shown in FIG. 9B, when all of the initial state selecting signals A, C, and D except for the initial state selecting signal B are at a low level, the NAND gate ND64 may invert the delay monitoring clock DLY_IN and output it to the unit delay 412. Meanwhile, the NAND gates ND62, ND63, and ND65 may output high-level signals to the unit delays 410 and 411 and the NAND gate ND61, respectively. Accordingly, the delay monitoring clock DLY_IN may be inverted by the NAND gate ND64, then delayed by the unit delay 412, and inverted again by the NAND gate ND61, such that the delay monitoring clock DLY_IN may be output at an original phase.

Even if the change in PVT is generated, a minimum delay amount may be detected in which the accurate and stable delay locking operation may be performed, and the delay amount may be set as a delay amount of the initial state of the delay locked loop.

If the initial state setting is completed and the reset signal RST is enabled, the first to third delay units 200 to 400 may delay and output the received clocks FCLK, RCLK, and DLY_IN by the delay amount that is set as the delay amount in the initial state.

The phase comparator 19 may compare the rising edges of the reference clock REF_CLK and the feedback clock FB_CLK and output the phase detecting signal CTRL.

The shift controller 18 may output the shift control signals SR and SL in response to the phase detecting signal CTRL.

The shift register 17 may determine the delay amounts by the first to third delay lines 200 to 400 in response to the shift control signals SR and SL. If the shift control signal SR is input, the shift register 17 may shift the register value to the right side, and if the shift control signal SL is input, the shift register 17 may shift the register value to the left side. In this way, the shift register 17 may adjust the delay amount.

The shift controller 18 may then output the delay locked signal DLL_LOCK indicating that a delay locking operation has been performed at a timing when the feedback clock FB_CLK and the reference clock REF_CLK have the least amount of jitter.

The first and second drivers 20 and 21 may drive the output IFCLK of the first delay line 200 and the output IRCLK of the second delay line 300 in response to the delay locked signal DLL_LOCK, which may generate the first delay locked loop clock FCLK_DLL and the second delay locked loop clock RCLK_DLL synchronized with the external clock CLK.

It will be apparent to those skilled in the art that various modifications and changes may be made without departing from the scope and spirit of the invention. Therefore, it should be understood that the above embodiments are not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

According to the exemplary embodiments, the delay lines may freely adjust the delay amounts at the time of the initial operation. Accordingly, in addition to the normal operation, an accurate and stable delay locking operation may be performed even though a change in PVT is generated. The function of the delay locked loop may be improved, and the function and reliability of the semiconductor memory apparatus using the delay locked loop may be improved.

What is claimed is:

1. A delay locked loop circuit comprising:
   a register controlled delay part adapted to receive initial state setting signals and a phase detecting signal, receive and delay a plurality of clocks input during an initial operation by delay amounts among varied initial delay amounts set according to the initial state setting signals, and increase or decrease the set delay amounts according to the phase detecting signal after the initial operation, wherein the register controlled delay part comprises a plurality of delay lines configured to receive the initial state setting signals or register values and receive and delay the plurality of clocks by the delay amounts set according to the initial state setting signals or register values, a shift register configured to receive shift control signals and output register values corresponding to the shift control signals and a shift controller configured to receive the phase detecting signal and output the shift control signals to the shift register in accordance with the phase detecting signal;
   a phase comparator adapted to receive the plurality of clocks and the plurality of clocks delayed by the register controlled delay part, compare a phase of any one of the plurality of clocks and a phase of any one of a plurality of clocks delayed by the register controlled delay part, and output the phase detecting signal; and
   an initial state setting unit adapted to generate the initial state setting signals, wherein the initial state setting unit comprises:
      a fuse having a first end coupled to a power supply terminal and a second end;
      a first switching element coupled between the second end of the fuse and a ground terminal and is adapted to be turned on according to the reset signal;
      an inverting element coupled to the second end of the fuse and providing an output; and
      a second switching element coupled to the ground terminal and a connecting node between the fuse and the inverting element and is adapted to be turned on according to the output of the inverting element.

2. The delay locked loop circuit of claim 1,
   wherein each of the plurality of delay lines comprises:
   a plurality of unit delays adapted to receive output signals of previous terminals;
   a signal input unit adapted to input received signals to any one of the plurality of unit delays, which corresponds to any one of initial state selecting signals; and
   an initial state selecting unit adapted to receive the initial state setting signals, generate the initial state selecting signals in response to the initial state setting signals and output the initial state selecting signals to the signal input unit.

3. The delay locked loop circuit of claim 2, wherein the signal input unit comprises:

a plurality of logic elements adapted to invert the received signals and output the received signals to the plurality of unit delays in accordance with the initial state selecting signals.

4. The delay locked loop circuit of claim 2, wherein the initial state selecting unit comprises:

a plurality of logic circuits adapted to receive the initial state setting signals and generate the initial state selecting signals using a reset signal when the initial state setting signals are activated.

5. The delay locked loop circuit of claim 4, wherein each of the plurality of logic circuits comprises:

two latch circuits adapted to receive the initial state setting signals and generate the initial state selecting signals having different levels using the reset signal in accordance with the initial state setting signals.

6. The delay locked loop circuit of claim 4, wherein each of the plurality of logic circuits comprises:

a first logic element adapted to receive the reset signal and output an output of the first logic element;

a first switching element adapted to receive the output of the first logic element and the initial state setting signals and allow the output of the first logic element to be fed back to the first logic element in accordance with the initial state setting signals;

a second switching element adapted to receive the initial state setting signals and receive and output the output of the first logic element as the initial state selecting signal in accordance with the initial state setting signals;

a second logic element adapted to receive the reset signal and output an output of the second logic element;

a third switching element adapted to receive the output of the second logic element and the initial state setting signals, allow the output of the second logic element to be fed back to the second logic element in accordance with the initial state setting signals, and output an output of the third switching element; and a fourth switching element adapted to receive the initial state setting signals and receive and output the output of the third switching element as the initial state selecting signal in accordance with the initial state setting signals.

7. The delay locked loop circuit of claim 1, wherein the initial state setting signals comprise test mode signals.

* * * * *